United States Patent
Kang et al.

(10) Patent No.: US 12,057,380 B2
(45) Date of Patent: Aug. 6, 2024

(54) SEMICONDUCTOR PACKAGE

(71) Applicant: SAMSUNG ELECTRONICS CO., LTD., Suwon-si (KR)

(72) Inventors: Myungsam Kang, Hwaseong-si (KR); Bongju Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 92 days.

(21) Appl. No.: 17/581,227

(22) Filed: Jan. 21, 2022

(65) Prior Publication Data

US 2022/0367327 A1    Nov. 17, 2022

(30) Foreign Application Priority Data

May 17, 2021   (KR) ........................ 10-2021-0063356

(51) Int. Cl.
*H01L 23/498*    (2006.01)
*H01L 23/00*     (2006.01)

(52) U.S. Cl.
CPC .. *H01L 23/49811* (2013.01); *H01L 23/49822* (2013.01); *H01L 24/16* (2013.01); *H01L 24/73* (2013.01); *H01L 2224/16227* (2013.01); *H01L 2224/73204* (2013.01); *H01L 2224/81411* (2013.01); *H01L 2224/81439* (2013.01); *H01L 2224/81444* (2013.01); *H01L 2224/81447* (2013.01); *H01L 2224/81455* (2013.01)

(58) Field of Classification Search
CPC ............... H01L 23/49811; H01L 24/16; H01L 23/49816; H01L 24/02
See application file for complete search history.

(56) References Cited

U.S. PATENT DOCUMENTS

| | | |
|---|---|---|
| 9,159,665 B2 | 10/2015 | Pendse |
| 9,741,589 B2 | 8/2017 | Liu et al. |
| 10,446,515 B2 | 10/2019 | Tsai et al. |
| 10,535,593 B2 | 1/2020 | Chang et al. |
| 10,602,621 B1 | 3/2020 | Hu |
| 2012/0161312 A1 | 6/2012 | Hossain et al. |

(Continued)

FOREIGN PATENT DOCUMENTS

KR    101300571 B1    7/2013

*Primary Examiner* — Michele Fan
(74) *Attorney, Agent, or Firm* — Fish & Richardson P.C.

(57) ABSTRACT

A semiconductor package includes: a redistribution substrate including a lower insulating layer, a redistribution via penetrating through the lower insulating layer, a redistribution layer connected to the redistribution via on the lower insulating layer, and an upper insulating layer on the lower insulating layer and having a first surface and a second surface opposing the first surface; a pad structure including a pad portion, disposed on the first surface of the redistribution substrate, and a via portion penetrating through the upper insulating layer to connect the redistribution layer and the pad portion to each other; a semiconductor chip disposed on the first surface of the redistribution substrate and including a pad; and a connection member in contact with the pad portion and the pad of the semiconductor chip between the pad structure and the pad of the semiconductor chip. The pad portion of the pad structure has a hemispherical shape, and a side surface of the via portion of the pad structure is in contact with the upper insulating layer.

17 Claims, 14 Drawing Sheets

(56) References Cited

U.S. PATENT DOCUMENTS

| | | | |
|---|---|---|---|
| 2014/0339699 A1* | 11/2014 | Arvin | H01L 21/76885 |
| | | | 257/738 |
| 2019/0109093 A1 | 4/2019 | Koduri | |
| 2019/0131225 A1* | 5/2019 | Jeong | H01L 21/4853 |
| 2019/0148323 A1* | 5/2019 | Gu | H01L 23/49816 |
| | | | 257/774 |
| 2020/0027838 A1 | 1/2020 | Yu et al. | |
| 2020/0075470 A1 | 3/2020 | Kuo et al. | |
| 2021/0098400 A1* | 4/2021 | Shen | H01L 24/05 |

* cited by examiner

SEMICONDUCTOR PACKAGE

CROSS-REFERENCE TO RELATED APPLICATION(S)

This application claims benefit of priority to Korean Patent Application No. 10-2021-0063356 filed on May 17, 2021 in the Korean Intellectual Property Office, the disclosure of which is incorporated herein by reference in its entirety.

BACKGROUND

The present disclosure relates to a semiconductor package.

In general, a semiconductor package may include a printed circuit board (PCB) and a semiconductor chip mounted on the PCB. In general it may be difficult for such a semiconductor package structure to reliably package semiconductor chips required to have the desired necessary levels of multifunctionality and high performance.

SUMMARY

Exemplary embodiments provide a semiconductor package having high reliability.

According to an exemplary embodiments, a semiconductor package includes: a redistribution substrate including a lower insulating layer, a redistribution via penetrating through the lower insulating layer, a redistribution layer connected to the redistribution via on the lower insulating layer, and an upper insulating layer disposed on the lower insulating layer and having a first surface and a second surface opposing the first surface; a pad structure including a pad portion, disposed on the first surface of the redistribution substrate, and a via portion penetrating through the upper insulating layer to connect the redistribution layer and the pad portion to each other; a semiconductor chip disposed on the first surface of the redistribution substrate and including a pad; and a connection member in contact with the pad portion and the pad of the semiconductor chip between the pad structure and the pad of the semiconductor chip. The pad portion of the pad structure has a hemispherical shape, and a side surface of the via portion of the pad structure being in contact with the upper insulating layer.

According to an exemplary embodiments, a semiconductor package includes: a redistribution substrate including a lower insulating layer, a redistribution via penetrating through the lower insulating layer, a redistribution layer connected to the redistribution via on the lower insulating layer, and an upper insulating layer on the lower insulating layer and having a first surface and a second surface opposing the first surface; a pad structure including a pad portion, disposed on the first surface of the redistribution substrate, and a via portion penetrating through the upper insulating layer to connect the redistribution layer and the pad portion to each other; a semiconductor chip disposed on the first surface of the redistribution substrate and including a pad; and a connection member disposed between the pad structure and the pad of the semiconductor chip. The pad portion of the pad structure has a hemispherical shape, and includes a first conductive material layer and a second conductive material layer disposed on the first conductive material layer and having a thickness less than a thickness of the first conductive material layer.

According to an exemplary embodiment, a semiconductor package includes: a redistribution substrate including a lower insulating layer, a redistribution via penetrating through the lower insulating layer, a redistribution layer connected to the redistribution via on the lower insulating layer, and an upper insulating layer on the lower insulating layer and having a first surface and a second surface opposing the first surface; a pad structure including a pad portion, disposed on the first surface of the redistribution substrate, and a via portion penetrating through the upper insulating layer to connect the redistribution layer and the pad portion to each other; a semiconductor chip disposed on the first surface of the redistribution substrate and electrically connected to the redistribution layer; and a connection member disposed between the pad structure and the pad of the semiconductor chip. The pad portion of the pad structure includes a first conductive material layer and a second conductive material layer disposed on the first conductive material layer and including a material different from a material of the first conductive material layer, and each of the first conductive material layer and the second conductive material layer being in contact with an upper surface of the upper insulating layer.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, exemplary embodiments will be described with reference to the accompanying drawings.

Figure 1:
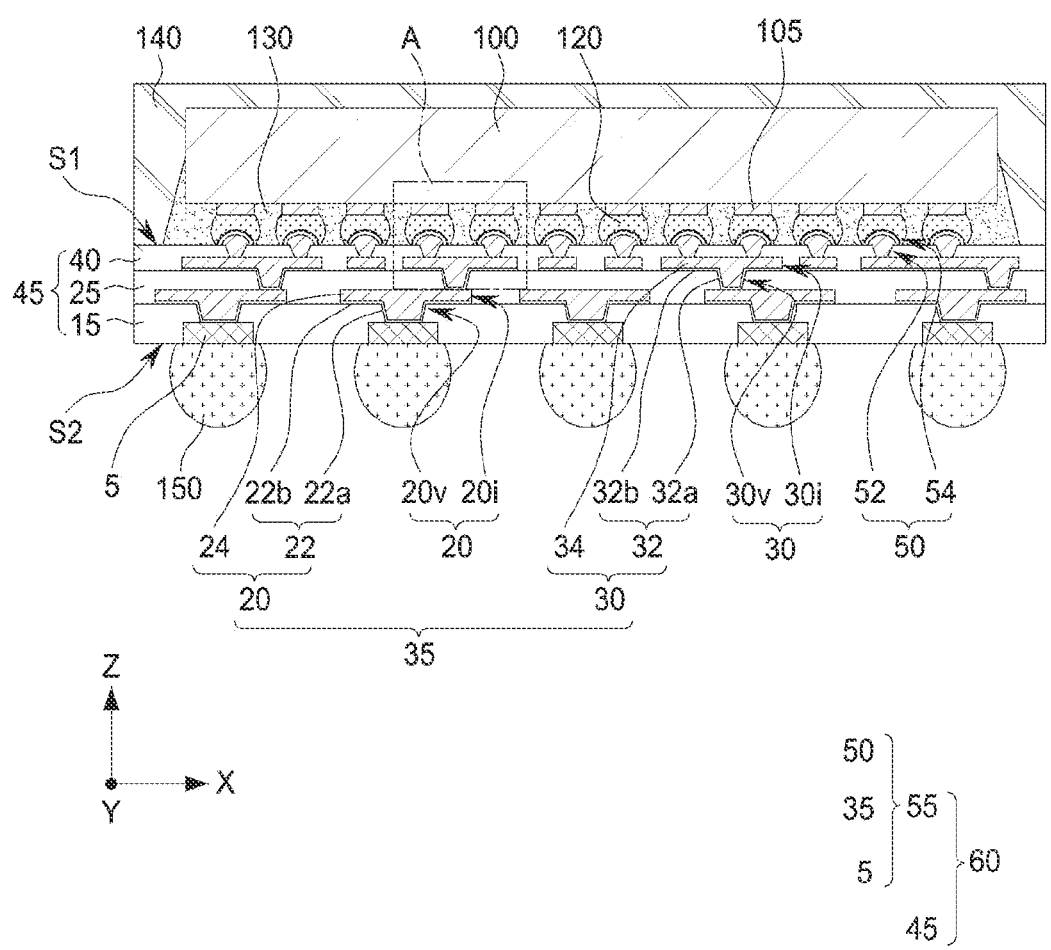
FIG. 1 is a cross-sectional view according to an exemplary embodiment.
Figure 2:
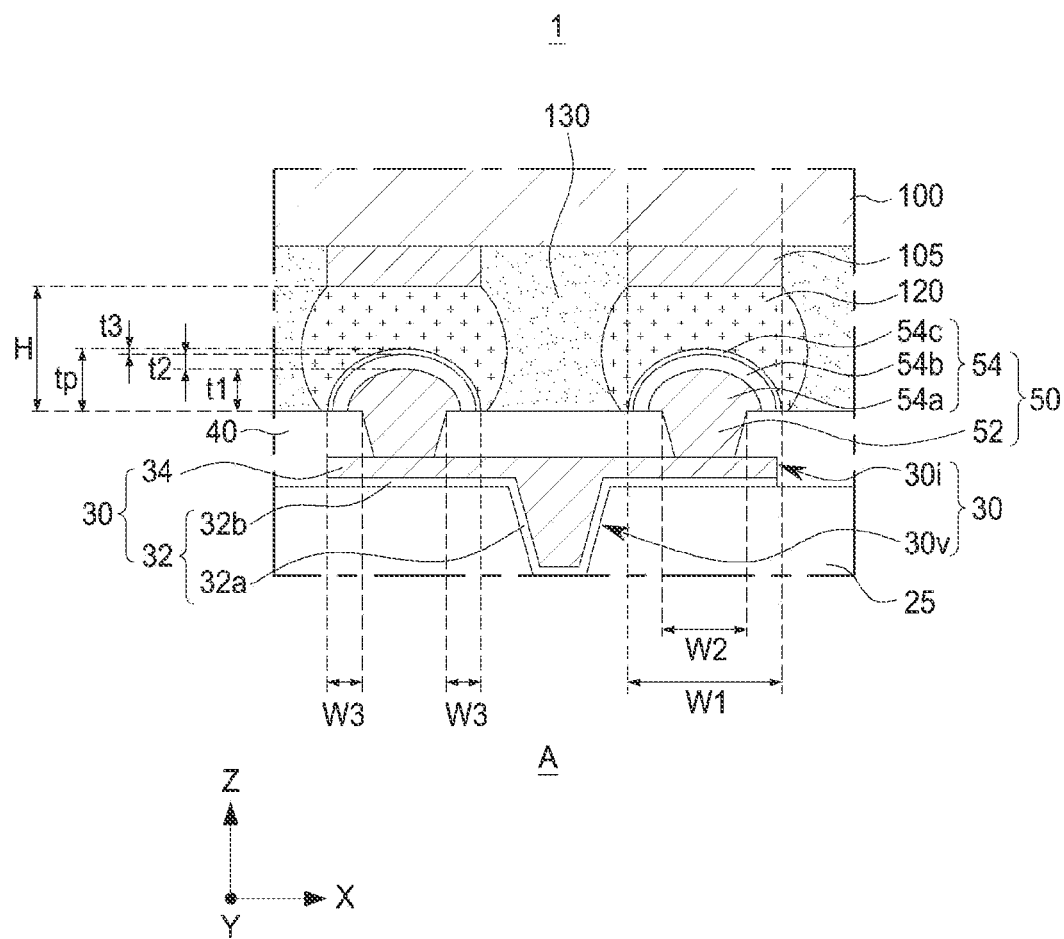
FIG. 2 is a partially enlarged view illustrating an example of portion "A" of FIG. 1.

FIG. 1 is a cross-sectional view according to an exemplary embodiment, and FIG. 2 is a partially enlarged view illustrating an example of portion "A" of FIG. 1.

Referring to FIGS. 1 and 2, a semiconductor package 1 may include a redistribution substrate 60 and a semiconductor chip 100 on the redistribution substrate 60. The semiconductor package 1 may further include an encapsulant 140, a connection member 120, and a connection bump 150.

The redistribution substrate 60 may have a first surface S1 and a second surface S2 opposing the first surface S1, and may include an insulating structure 45 and a conductive structure 55.

The insulating structure 45 may include a first lower insulating layer 15, a second lower insulating layer 25 on the first lower insulating layer 15, and an upper insulating layer 40 on the second lower insulating layer 25. Although the insulating structure 45 is illustrated as including three insulating layers 15, 25, and 40, exemplary embodiments are not limited thereto and the insulating structure 45 may include two insulating layers, four or more insulating layers. The upper insulating layer 40 may cover an upper surface and a side surface of the upper redistribution pattern 30.

The insulating structure 45 may include an insulating material. The insulating material may include a thermosetting resin such as an epoxy resin, a thermoplastic resin such as polyimide, a resin in which the thermosetting resin or the thermoplastic resin is mixed with a core material such as an inorganic filler or/and a glass fiber (or a glass cloth or a glass fabric), such as prepreg, an Ajinomoto Built-up Film (ABF), FR-4, or Bismaleimide Triazine (BT). The insulating structure 45 may include a photosensitive resin such as a photoimageable dielectric (PID) resin. The first lower insulating layer 15, the second lower insulating layer 25, and the upper insulating layer 40 may include the same or different materials, and boundaries of insulating layers disposed at different levels may be not apparent according to a process.

The conductive structure 55 may include a lower conductive pattern 5, a redistribution structure 35 on the lower conductive pattern 5, and a pad structure 50 on the redistribution structure 35. The lower conductive pattern 5 may be plural in number. The pad structure 50 may be plural in number.

The lower conductive pattern 5 may include a metal material. The lower conductive pattern 5 may include a metal material, similar to a metal material included in the redistribution structure 35. For example, the lower conductive pattern 5 may include copper (Cu).

The redistribution structure 35 may include a plurality of redistribution patterns 20 and 30 disposed at different height levels. For example, the plurality of redistribution patterns 20 and 30 may include a lower redistribution pattern 20 and an upper redistribution pattern 30. In FIG. 1, the plurality of redistribution patterns 20 and 30 are illustrated as including two redistribution patterns disposed at different height levels, but exemplary embodiments are not limited thereto and the plurality of redistribution patterns 20 and 30 may include three or more redistribution patterns. For example, one or a plurality of redistribution patterns having a structure similar to a structure of the upper redistribution pattern may be disposed between the lower redistribution pattern 20 and the upper redistribution pattern 30.

The lower redistribution pattern 20 and the upper redistribution pattern 30 may include redistribution vias 20v and 30v and redistribution layers 20i and 30i, respectively. The redistribution layers 20i and 30i may be disposed on the insulating layers 15 and 25. For example, the redistribution layers 20i and 30i may include a first redistribution layer 20i, disposed on the first lower insulating layer 15, and a second redistribution layer 30i disposed on the second lower insulating layer 25. The lower redistribution pattern 20 may include the first redistribution via 20v, penetrating through the first lower insulating layer 15, and the first redistribution layer 20i extending from the first redistribution via 20v and disposed on the first lower insulating layer 15. The upper redistribution pattern 30 may include the second redistribution via 30v, penetrating through the second lower insulating layer 25 and electrically connected to the lower redistribution pattern 20, and the second redistribution layer 30i extending from the second redistribution via 30v and disposed over the second lower insulating layer 25.

The first and second redistribution vias 20v and 30v may have a shape in which side surfaces thereof are tapered. For example, each of the first redistribution via 20v and the second redistribution via 30v may have a tapered shape such that a width of a lower surface is less than a width of an upper surface. The widths of the upper and lower surfaces of the first and second redistribution vias 20v and 30v may include widths of the seed metal layers 22 and 32, respectively surrounding side surfaces of the first and second redistribution vias 20v and 30v.

The lower redistribution pattern 20 and the upper redistribution pattern 30 may include seed metal layers 22 and 32 and metal material patterns 24 and 34 sequentially stacked, respectively. The lower redistribution pattern 20 may include a first seed metal layer 22 and a first metal material pattern 24. The upper redistribution pattern 30 may include a second seed metal layer 32 and a second metal material pattern 34.

The seed metal layers 22 and 32 may include first portions 22a and 32a, surrounding side surfaces and lower surfaces of the redistribution vias 20v and 30v, and second portions 22b and 32b disposed between the redistribution layers 20i and 30i and the insulating layers 15 and 25. The first portions 22a and 32a of the seed metal layers 22 and 32 may be disposed between the redistribution vias 20v and 30v and the lower insulating layers 15 and 25. The first portions 22a and 32a of the seed metal layers 22 and 32 may be formed conformally along internal walls of the redistribution vias 20v and 30v. The second portions 22b and 32b of the seed metal layers 22 and 32 may cover at least a portion of lower surfaces of the redistribution layers 20i and 30i. The second portions 22b and 32b of the seed metal layers 22 and 32 may be disposed between upper surfaces of the lower insulating layers 15 and 25 and the redistribution layers 20i and 30i. The first portions 22a and 32a of the seed metal layers 22 and 32 may be continuously connected to the second portions 22b and 32b of the seed metal layers 22 and 32. The first seed metal layer 22 may include a first portion 22a, surrounding a side surface and a lower surface of the first redistribution via 20v, and a second portion 22b disposed between the first redistribution layer 20i and the first lower insulating layer 15. The second seed metal layer 32 may include a first portion 32a, surrounding a side surface and a lower surface of the second redistribution via 30v, and a second portion 32b disposed between the second redistribution layer 30i and the second lower insulating layer 25.

The seed metal layers 22 and 32 may be formed of a metal material, for example, copper (Cu), aluminum (Al), silver (Ag), tin (Sn), gold (Au), nickel (Ni), lead (Pb), titanium (Ti), or alloys thereof. The seed metal layers 22 and 32 may be in the form of a thin film having a single-layer or a multilayer structure. The seed metal layers 22 and 32 may include, for example, a first layer including titanium and a second layer including copper. The metal material patterns 24 and 34 may include a metal material, for example, copper (Cu), aluminum (Al), silver (Ag), tin (Sn), gold (Au), nickel (Ni), lead (Pb), titanium (Ti), or any alloys thereof.

The redistribution structure 35 may perform various functions depending on their design thereof. For example, the redistribution structure 35 may include a ground (GND) pattern, a power (PWR) pattern, a signal (S) pattern, and the like. The signal (S) pattern may include various signals, other than the ground (GND) pattern, the power (PWR) pattern, and the like, such as a data signal, and the like.

The pad structure 50 may include a pad portion 54 and a via portion 52. The pad structure 50 may be plural in number.

The pad portion 54 may be disposed at a level higher than an upper surface of the insulating structure 45, for example, an upper surface of the upper insulating layer 40. The pad portion 54 may be disposed on a first surface S1 of the redistribution substrate 60. The via portion 52 may extend downwardly from at least a portion of the pad portion 54 to be electrically connected to the redistribution structure 35.

The pad portion 54 may include a first conductive material layer 54a extending from the via portion 52, a second conductive material layer 54b on the first conductive material layer 54a, and a third conductive material layer 54c on the second conductive material layer 54b. A thickness t2 of the second conductive material layer 54b may be less than a thickness t1 of the first conductive material layer 54a. A thickness t3 of the third conductive material layer Mc may be less than the thickness t1 of the first conductive material layer 54a. The thickness t3 of the third conductive material layer Mc may be less than the thickness t2 of the second conductive material layer 54b. In FIG. 2, the conductive material layers 54a, 54b, and Mc are illustrated as including three layers, but exemplary embodiments are not limited thereto. According to exemplary embodiments, the conductive material layer may include a single layer or two or more layers.

The first conductive material layer 54a may include, for example, copper (Cu). The via portion 52 may include the same material as the first conductive material layer 54a. The second conductive material layer 54b may include a conductive material different from that of the first conductive material layer 54a. The second conductive material layer 54b may include at least one of, for example, gold (Au), nickel (Ni), benzimidazole, tin (Sn), and a tin-silver ally (SnAg). The third conductive material layer 54c may include a conductive material different from that of the second conductive material layer 54b. When the second conductive material layer 54b includes nickel (Ni), the third conductive material layer 54c may include, for example, gold (Au). Each of the second conductive material layer 54b and the third conductive material layer 54c may be formed by electroplating or electroless plating.

As described with reference to FIG. 9E, the pad structure 50 is formed by a bottom-up plating method using the lower seed layer 1100 on the lower carrier structure 1000. Therefore, the pad portion 54 of the pad structure 50 may have a hemispherical shape. An upper surface of the pad portion 54 may have a curved shape. An upper surface of the first conductive material layer 54a may have a curved shape. An upper surface of the second conductive material layer 54b may have a curved shape. An upper surface of the third conductive material layer 54c may have a curved shape.

A maximum width W1 of the pad portion 54 may be, for example, about 4 µm to about 10 µm greater than a maximum width W2 of the via portion 52. In exemplary embodiments, the maximum width W1 of the pad portion 54 may be a width of the lower surface of the pad portion 54. The maximum width W1 of the pad portion 54 may be greater than the maximum width W2 of the via portion 52, for example, about 4 µm to about 7 µm. The width W3 of the pad portion 54 in contact with the upper surface of the upper insulating layer 40 may range from about 2 µm to about 5 µm, for example. Since the pad structure 50 is formed by a bottom-up plating method, a lower surface of the pad portion 54 may be formed to have a narrow width. A thickness tp of the pad portion 54 may range from about 2.5 µm to about 6 µm.

As described with reference to FIG. 9E, the pad structure 50 is formed by a bottom-up plating method using the lower seed layer 1100 on the lower carrier structure 1000. Therefore, a seed metal layer may be omitted between the pad structure 50 and the upper insulating layers 40. For example, a portion of the lower surface of the pad portion 54 may be in contact with the upper insulating layer 40. A side surface of the via portion 52 may be in contact with the upper insulating layer 40. A lower surface of the via portion 52 may be in contact with the second redistribution layer 30i. At least a portion of the first conductive material layer 54a may be in contact with the upper insulating layer 40. A portion of the first conductive material layer 54a may be in contact with the upper surface of the upper insulating layer 40. At least a portion of the second conductive material layer 54b may be in contact with the upper insulating layer 40. A portion of the second conductive material layer 54b may be in contact with the upper surface of the upper insulating layer 40. At least a portion of the third conductive material layer 54c may be in contact with the upper insulating layer 40. A portion of the third conductive material layer 54c may be in contact with the upper surface of the upper insulating layer 40.

The via portion 52 may electrically connect the redistribution structure 35 and the pad portion 54 to each other. The via portion 52 may be disposed between the second redistribution layer 30i and the pad portion 54 and may electrically connect the second redistribution layer 30i and the pad portion 54 to each other. The via portion 52 may penetrate through the upper insulating layer 40.

The semiconductor chip 100 may disposed on the first surface S1 of the redistribution substrate 60 and include a pad 105 electrically connected to the redistribution structure 35. The semiconductor chip 100 may be singular or plural in number. A width of the pad 105 of the semiconductor chip 100 may be substantially the same as the maximum width W1 of the pad portion 54 of the pad structure 50, but exemplary embodiments are not limited thereto. In other embodiments, the width of the pad 105 of the semiconductor chip 100 may be greater than the maximum width W1 of the pad portion 54 of the pad structure 50. The pad 105 of the semiconductor chip 100 may be referred to as a bump.

The semiconductor chip 100 may include at least one of a logic chip and a memory chip. For example, the semiconductor chip 100 may include a microprocessor such as a central processor unit (CPU), a graphics processor unit (GPU), and an application processor (AP), a logic chip such as a field programmable gate array (FPGA) and an application-specific IC (ASIC), or a memory chip. The memory chip may be a volatile memory chip or a nonvolatile memory chip. For example, the volatile memory chip may include a dynamic random access memory (DRAM), a static RAM (SRAM), a thyristor RAM (TRAM), a zero capacitor RAM (ZRAM), or a twin transistor RAM (TTRAM). In addition, the nonvolatile memory chip may include, for example, a flash memory, a magnetic RAM (MRAM), a spin-transfer torque MRAM (STT-MRAM), a ferroelectric RAM (FRAM), a phase change RAM (PRAM), and a resistive RRAM (RRAM), a nanotube RRAM, a polymer RAM, a nano-floating gate memory, a holographic memory, a molecular electronics memory, or an insulator resistance change memory.

The semiconductor chip 100 may be mounted on the redistribution substrate 60 in a flip-chip bonding manner.

For example, the lower surface of the semiconductor chip 100 may be spaced apart from the first surface S1 of the redistribution substrate 60.

The pad 105 of the semiconductor chip 100 may be connected to the redistribution structure 35 or the pad portion 54 of the pad structure 50 through an additional connection member 120. The connection member 120 may be disposed between the semiconductor chip 100 and the pad structure 50. The connection member 120 may be disposed between the pad 105 of the semiconductor chip 100 and the pad structure 50. The connection member 120 may be in contact with the pad 105 of the semiconductor chip 100 and the pad portion 54 of the pad structure 50.

The connection member 120 may be formed to cover the entire upper surface of the pad portion 54 having a curved shape. Since the connection member 120 is formed to cover the entire upper surface of the pad portion 54, the pad structure 50 and an underfill resin 130 may be disposed to be spaced apart from each other. The pad structure 50 may be disposed to be spaced apart from the encapsulant 140. In other embodiments, even when the underfill resin 130 is omitted, the pad portion 54 of the pad structure 50 may be disposed to be spaced apart from the encapsulant 140. The first conductive material layer 54a of the pad portion 54 may be disposed to be spaced apart from the underfill resin 130. The second conductive material layer 54b of the pad portion 54 may be disposed to be spaced apart from the underfill resin 130. The third conductive material layer 54c of the pad portion 54 may be disposed to be spaced apart from the underfill resin 130.

Since the pad portion 54 of the pad structure 50 has a hemispherical shape, a contact area between the pad portion 54 and the connection member 120 may be increased to be relatively larger than when the pad portion 54 has a flat upper surface. Accordingly, connection stability between the redistribution substrate 60 and the semiconductor chip 100 may be increased. In exemplary embodiments, the connection member 120 may be in contact with the redistribution substrate 60. In exemplary embodiments, the connection member 120 may include a portion in contact with the upper insulating layer 40. However, in other embodiments, the connection member 120 may not include a portion in contact with the upper insulating layer 40 and may only be in contact with the upper surface of the pad portion 54.

A maximum width of the connection member 120 may be greater than the maximum width W1 of the pad portion 54 of the pad structure 50. The maximum width of the connection member 120 may be greater than a maximum width of the pad 105 of the semiconductor chip 100. A height H of the connection member 120 may be substantially the same as a distance between a lower surface of the pad 105 of the semiconductor chip 100 and an upper surface of the upper insulating layer 40.

The connection member 120 may be in the form of a land, a ball, or a pin. The connection member 120 may include, for example, tin (Sn) or a tin-containing alloy (Sn—Ag—Cu).

The semiconductor package 1 may further include an underfill resin 130 disposed between the redistribution substrate 60 and the semiconductor chip 100 and surrounding a side surface of the connection member 120. The underfill resin 130 may include an insulating resin such as an epoxy resin. According to exemplary embodiments, the underfill resin 130 may be formed by a molded under-fill (MUF) method to constitute a portion of the encapsulant 140.

The encapsulant 140 may be disposed on the first surface S1 of the redistribution substrate 60 and may encapsulate at least a portion of the redistribution substrate 60 and the semiconductor chip 100. The encapsulant 140 may surround a side surface of the semiconductor chip 100 and may cover an upper surface of the semiconductor chip 100. The encapsulant 140 may be, for example, a thermosetting resin such as an epoxy resin, a thermoplastic resin such as polyimide, or a prepreg including an inorganic filler and/or glass fiber, Ajinomoto Build-up Film (ABF), FR-4, Bismaleimide Triazine (BT), an epoxy molding compound (EMC), or PID.

The connection bump 150 may be disposed on the second surface S2 of the redistribution substrate 60, and may be electrically connected to the lower conductive pattern 5. The connection bump 150 may include a low melting-point metal, for example, tin (Sn) or a tin-containing alloy (Sn—Ag—Cu). The connection bump 160 may be a land, a ball, or a pin. The connection bump 150 may include a copper pillar or a solder ball.

Next, various modified examples of some elements of the above-described semiconductor package 1 will be described. Hereinafter, among the elements of the semiconductor package 1, elements which can be modified or replaced will be described, and other elements will be directly mentioned or the description thereof will be omitted as redundant.

Figure 4:
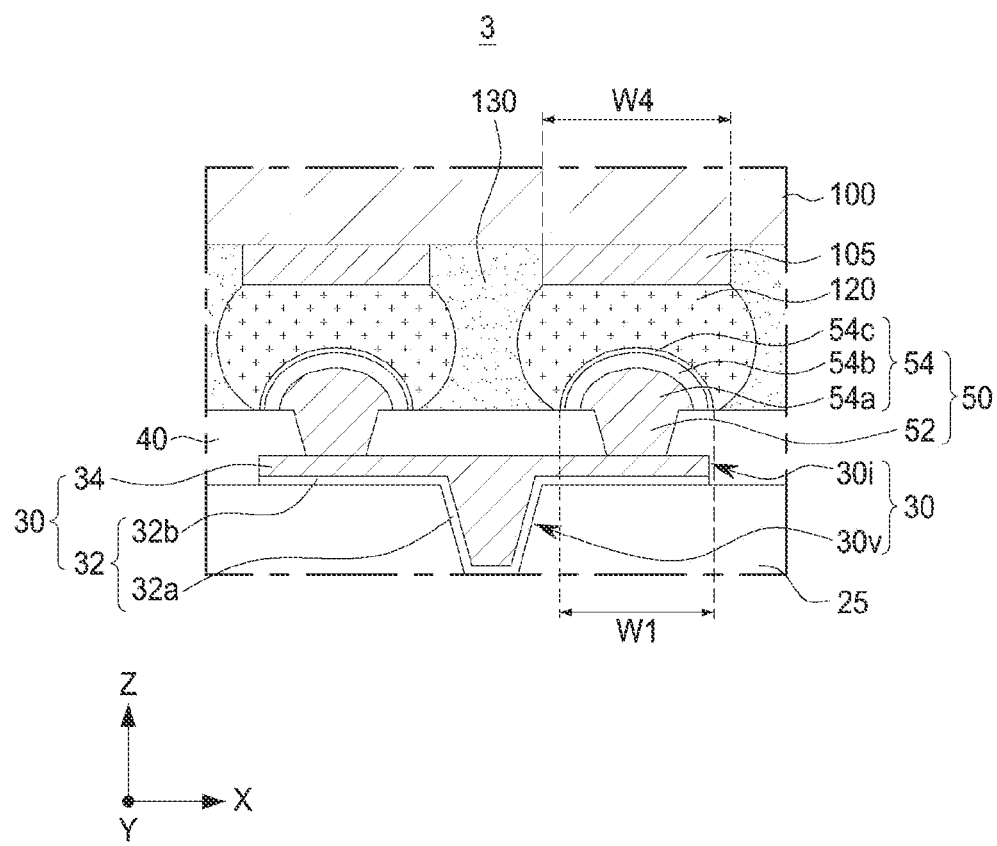
FIG. 4 is a cross-sectional view illustrating a modified example of a semiconductor package according to an exemplary embodiment.
Figure 5:
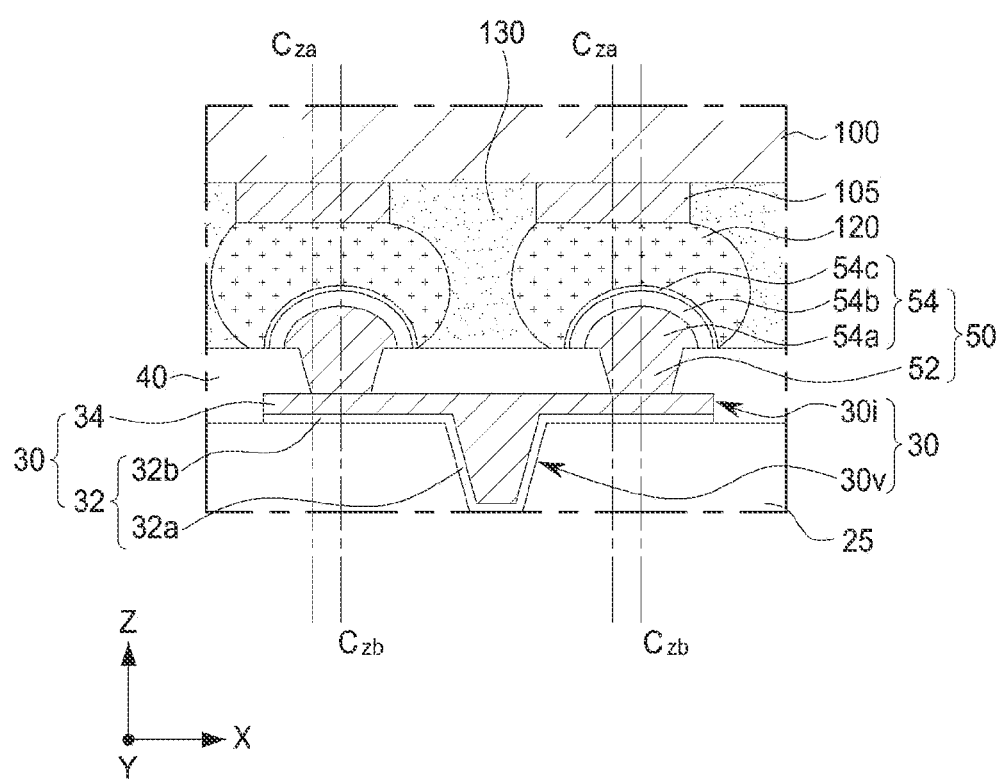
FIG. 5 is a cross-sectional view illustrating a modified example of a semiconductor package according to an exemplary embodiment.

Various modified examples in FIG. 2 will be described with reference to FIGS. 3 to 5, respectively. Each of FIGS. 3 to 5 is a partially enlarged view which may correspond to region "A" of FIG. 1, and may represent an element, which can be modified or replaced, from among the elements of FIG. 2.

Figure 3:
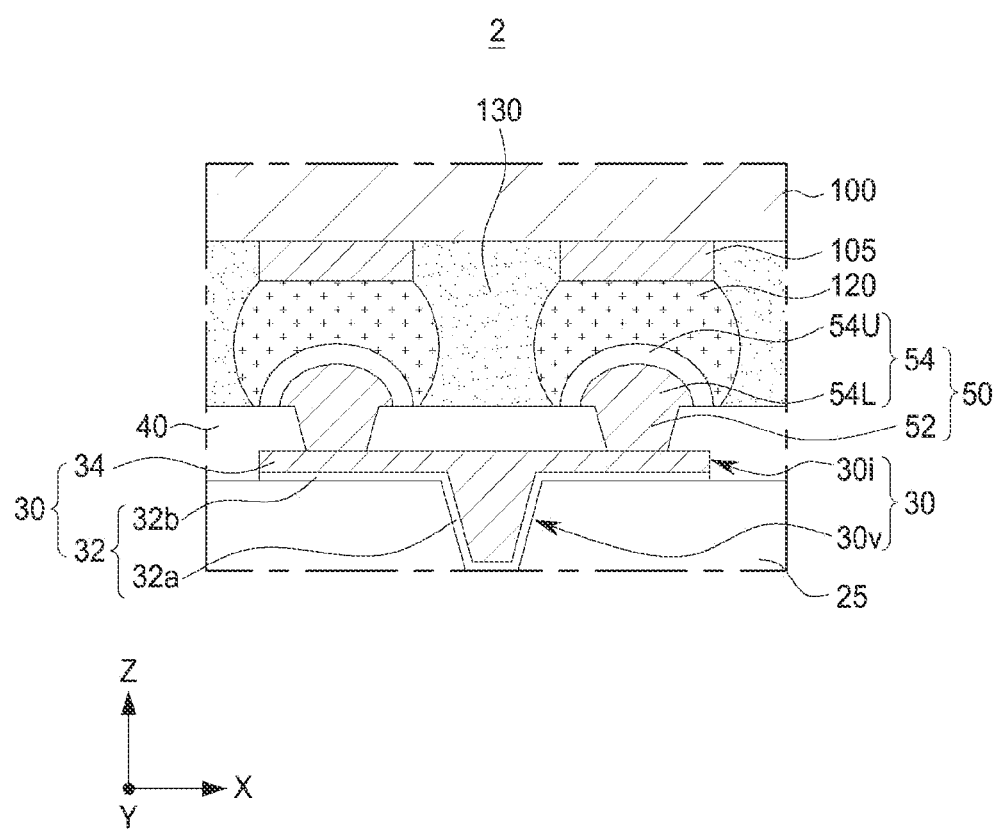
FIG. 3 is a cross-sectional view illustrating a modified example of a semiconductor package according to an exemplary embodiment.

Referring to FIG. 3, a pad structure 50 of a semiconductor package 2 may include a via portion 52 and a pad portion 54 including a lower conductive material layer 54L and an upper conductive material layer 54U on the lower conductive material layer 54L. For example, the pad structure 50 may include two conductive material layers.

The pad portion 54 may have a hemispherical shape. An upper surface of the pad portion 54 may form a curved shape. The lower conductive material layer 54L may be in contact with an upper insulating layer 40. At least a portion of the upper conductive material layer 54U may be in contact with the upper insulating layer 40.

The lower conductive material layer 54L may extend from the via portion 52. The lower conductive material layer 54L may include the same material as the via portion 52. For example, the lower conductive material layer 54L may include copper (Cu), or the like. The upper conductive material layer 54U may include a material different from that of the lower conductive material layer 54L. The upper conductive material layer 54U may include, for example, at least one of benzimidazole, tin (Sn), and a tin-silver alloy (SnAg).

Referring to FIG. 4, a maximum width W1 of a pad portion 54 of a pad structure 50 in a semiconductor package 3 may be different from a width W4 of the pad 105 of the semiconductor chip 100. In exemplary embodiments, the maximum width W1 of the pad portion 54 of the pad structure 50 may be less than the width W4 of the pad 105 of the semiconductor chip 100.

Referring to FIG. 5, a center of a pad structure 50 in a semiconductor package 4 and a center of the pad 105 of the semiconductor chip 100 may not be disposed in a line. A center line Czb, disposed in a center of the pad structure 50, may not match a center line Cza disposed at a center of the pad 105 of the semiconductor chip 100. For example, the pad 105 of the semiconductor chip 100 may be shifted and disposed in an X direction, based on the center of the pad structure 50.

Figure 6:
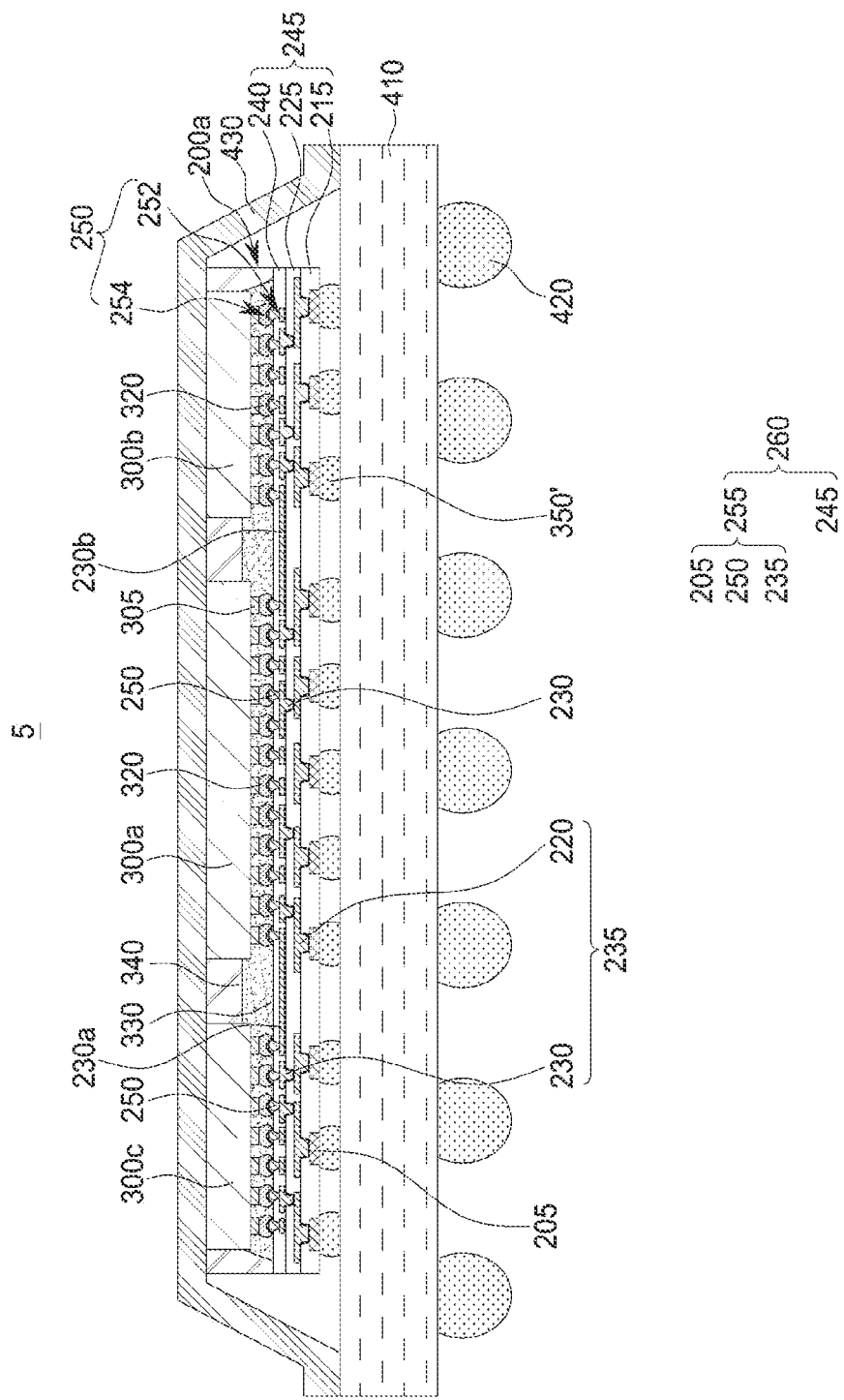
FIG. 6 is a cross-sectional view illustrating a modified example of a semiconductor package according to an exemplary embodiment.

FIG. 6 is a cross-sectional view illustrating a modified example of a semiconductor package according to an exemplary embodiment.

Referring to FIG. 6, a semiconductor package 5 may include a base substrate 410, a package 200a mounted on the base substrate 410, a heat dissipation structure 430 covering the package 200a on the base substrate 410, and a connection bump 420 below the base substrate 410. The connection bump 420 may include a solder ball or a conductive bump.

The package 200a may be formed by mounting the semiconductor package 200 on the base substrate 410. The semiconductor package 200 may include a redistribution substrate 260 and a plurality of semiconductor chips 300a, 300b, and 300c disposed on the redistribution substrate 260.

The redistribution substrate 260 may have a structure similar to that of the redistribution substrate 60 described with reference to FIG. 1. For example, the redistribution substrate 260 may include a conductive structure 255, including a pad structure 250 having a hemispherical shape, and an insulating structure 245.

The insulating structure 245 may include a first lower insulating layer 215, a second lower insulating layer 225, and an upper insulating layer 240 sequentially stacked. The first lower insulating layer 215, the second lower insulating layer 225, and the upper insulating layer 240 may correspond to the first lower insulating layer (15 of FIG. 1), the second lower insulating layer (25 of FIG. 1), and the upper insulating layer (40 in FIG. 1), respectively.

The conductive structure 255 may include lower conductive patterns 205, a redistribution structure 235 on the lower conductive patterns 205, and pad structures 250 on the redistribution structure 235. Each of the pad structures 250 may be substantially the same as one of the pad structures 50 described with reference to FIGS. 1 and 2. For example, each of the pad structures 250 may include a via portion 252 and a pad portion 254 having a hemispherical shape. The via portion 252 and the pad portion 254 may be substantially the same as the via portion 52 and the pad portion 54 of the pad structure 50 described with reference to FIGS. 1 and 2, respectively. A disposition relationship between the pad structure 250 and the pads 305 of the semiconductor chips 300a, 300b, and 300c or a relation of widths thereof may be substantially the same as described with reference to FIGS. 1 to 5.

The redistribution structure 235 may include lower redistribution patterns 220 and upper redistribution patterns 230 on the lower redistribution patterns 220. Each of the lower redistribution patterns 220 may be substantially the same as the lower redistribution pattern 20 described with reference to FIG. 1. For example, each of the lower redistribution patterns 220 may include a redistribution via, penetrating through the firsts lower insulating layer 215, and a redistribution layer extending from the redistribution via and disposed on the first lower insulating layer 215, in a manner similarly to that described in FIG. 1. At least some of the upper redistribution patterns 230 may be substantially the same as the upper redistribution patterns 30 described with reference to FIG. 1. For example, at least some of the upper redistribution patterns 230 may include a redistribution via, penetrating through the second lower insulating layer 225, and a redistribution layer extending from the redistribution via and disposed on the second lower insulating layer 225, in a manner similarly to that described in FIG. 1.

The redistribution substrate 260 may further include redistribution connection lines 230a and 230b electrically connecting at least two semiconductor chips, among the plurality of semiconductor chips 300a, 300b, and 300c. For example, the redistribution connection lines 230a and 230b may include the first and second redistribution connection lines 230a and 230b disposed at the same height level as the redistribution layer of the upper redistribution patterns 230.

The plurality of semiconductor chips 300a, 300b, and 300c may be spaced apart from each other in a direction, parallel to an upper surface of the insulating structure 245. Each of the plurality of semiconductor chips 300a, 300b, and 300c may be electrically connected to the redistribution substrate 260. The plurality of semiconductor chips 300a, 300b, and 300c may include a first semiconductor chip 300a, a second semiconductor chip 300b, and a third semiconductor chip 300c.

The first semiconductor chip 300a may be a processor chip such as a central processor unit (CPU) or a graphics processor unit (GPU), or a logic chip such as an application-specific IC (ASIC). At least one of the second semiconductor chip 300b and the third semiconductor chip 300c may be a chip stack structure including semiconductor chips sequentially stacked. For example, at least one of the second semiconductor chip 300b and the third semiconductor chip 300c may include a memory chip. For example, at least one of the second semiconductor chip 300b and the third semiconductor chip 300c may be a high bandwidth memory (HBM). For example, at least one of the second semiconductor chip 300b and the third semiconductor chip 300c may include a buffer die (or a logic die) and DRAM chips sequentially stacked on the buffer die (or the logic die).

The package 200a may further include an underfill resin 330 surrounding side surfaces of the connection members 320 between the plurality of semiconductor chips 300a, 300b, and 300c and the redistribution substrate 260. The package 200a may further include an encapsulant 340 surrounding side surfaces of at least the plurality of semiconductor chips 300a, 300b, and 300c on the redistribution substrate 260. The package 200a may further include connection bumps 350', respectively being in contact with the lower conductive patterns 205. The connection bumps 350' may be disposed between the package 200a and the base substrate 410, and may be bonded to the base substrate 410.

The package 200a may further include connection members 320 electrically connecting the plurality of semiconductor chips 300a, 300b, and 300c to the redistribution substrate 260. For example, the connection members 320 may be formed to cover the entire upper surface of the pad portion 254, similar to the connection member 120 of FIG. 1. Since each of the connection members 320 is formed to cover the entire upper surface of the pad portion 254, the pad structure 250 and the underfill resin 330 may be disposed to be spaced apart from each other. The pad structure 250 may be disposed to be spaced apart from the encapsulant 340. In other embodiments, even when the underfill resin 330 is omitted, the pad portion 254 of the pad structure 250 may be disposed to be spaced apart from the encapsulant 340.

The first semiconductor chip 300a may be electrically connected to each of the second and third semiconductor chips 300b and 300c through the first and second redistribution connection lines 230a and 230b. For example, the first redistribution connection line 230a may electrically connect the first semiconductor chip 300a and the third semiconductor chip 300c to each other, and the second redistribution connection line 230b may electrically connect the first semiconductor chip 300a and the second semiconductor chip 300b to each other.

The base substrate 410 may include a silicon interposer, a redistribution interposer, a printed circuit board (PCB), a ceramic substrate, a glass substrate, or a tape interconnection substrate.

The heat dissipation structure 430 may be disposed on the base substrate 410, and may cover the package 200a. In other embodiments, the heat dissipation structure 430 may be omitted. The heat dissipation structure 430 may be attached to the base substrate 410 and/or the package 200a by an adhesive. The heat dissipation structure 430 may include a conductive material having a thermal conductivity high enough to dissipate heat. For example, the heat dissipation structure 430 may include a metal or a metal alloy including gold (Au), silver (Ag), copper (Cu), iron (Fe), or the like, or a conductive material such as graphite, graphene, or the like. The conductive material of the heat dissipation structure 430 is not limited to the above-described materials. The heat dissipation structure 430 may have a shape different from that illustrated in FIG. 6.

Figure 7:
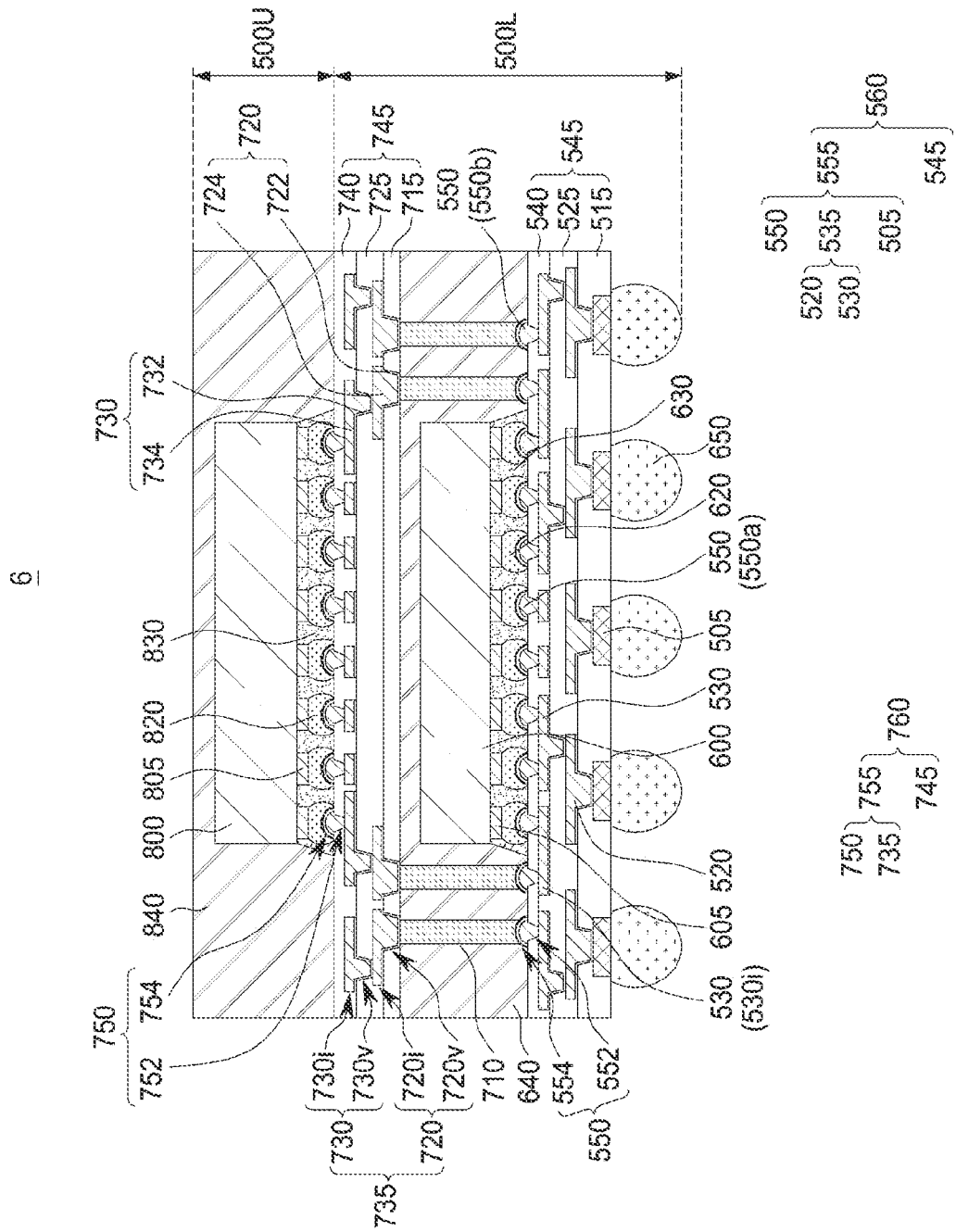
FIG. 7 is a cross-sectional view illustrating a modified example of a semiconductor package according to an exemplary embodiment.

FIG. 7 is a cross-sectional view illustrating a modified example of a semiconductor package according to an exemplary embodiment.

Referring to FIG. 7, a semiconductor package 6 may include a first structure 500L and a second structure 500U on the first structure 500L.

The first structure 500L may include a lower redistribution substrate 560 and a first semiconductor chip 600 disposed on the lower redistribution substrate 560.

The lower redistribution substrate 560 may have a structure similar to that of the redistribution substrate 60 described with reference to FIG. 1. For example, the lower redistribution substrate 560 may include a conductive structure 555, including a pad structure 550 having a hemispherical shape, and an insulating structure 545.

The insulating structure 545 may include a first lower insulating layer 515, a second lower insulating layer 525, and an upper insulating layer 540 sequentially stacked. The first lower insulating layer 515, the second lower insulating layer 525, and the upper insulating layer 540 may correspond to the first lower insulating layer (15 of FIG. 1), the second lower insulating layer (25 of FIG. 1), and the upper insulating layer (40 of FIG. 1), respectively.

The conductive structure 555 may include lower conductive patterns 505, a redistribution structure 535 on the lower conductive patterns 505, and a pad structure 550 on the redistribution structure 535. Each of the pad structures 550 may be substantially the same as one of the pad structures 50 described with reference to FIGS. 1 and 2. For example, each of the pad structures 550 may include a via portion 552 and a pad portion 554 having a hemispherical shape. The via portion 552 and the pad portion 554 may be substantially the same as the via portions 52 and the pad portions 54 of the pad structure 50 described with reference to FIGS. 1 and 2, respectively. A disposition relationship between the pad structure 550 and the pad 605 of the first semiconductor chip 600 or a relation between widths thereof may be substantially the same as described with reference to FIGS. 1 to 5.

The pad structures 550 may include a first pad structure 550a, overlapping the first semiconductor chip 600 and electrically connected to the first semiconductor chip 600, and a second pad structure 550b not overlapping the first semiconductor chip 600.

The redistribution structure 535 may include lower redistribution patterns 520 and upper redistribution patterns 530 on the lower redistribution patterns 520. Each of the lower redistribution patterns 520 may be substantially the same as the lower redistribution pattern 20 described with reference to FIG. 1. For example, each of the lower redistribution patterns 520 may include a redistribution via penetrating through the first lower insulating layer 515, and a redistribution layer extending from the redistribution via and disposed on the first lower insulating layer 515, similar to that described in FIG. 1. At least some of the upper redistribution patterns 530 may be substantially the same as the upper redistribution patterns 30 described with reference to FIG. 1. For example, at least some of the upper redistribution patterns 530 may include a redistribution via, penetrating through the second lower insulating layer 525, and a redistribution layer extending from the redistribution via and disposed on the second lower insulating layer 525, similar to that described in FIG. 1. Some of the upper redistribution patterns 530 may be redistribution connection lines 530i formed on the second lower insulating layer 525 in the same manner as the redistribution layer.

The first structure 500L may further include lower connection bumps 650 in contact with the lower conductive patterns 505 below the lower redistribution substrate 560.

The first structure 500L may further include an underfill resin 630 surrounding side surfaces of the connection members 620 between the first semiconductor chip 600 and the lower redistribution substrate 560. The first structure 500L may cover at least side surfaces of the first semiconductor chip 600, and may further include a first encapsulant 640 covering side surfaces of connection members 620 between the first semiconductor chip 600 and the lower redistribution substrate 560. The first encapsulant 640 may cover an upper surface of the first semiconductor chip 600.

The first structure 500L may further include the connection members 620 disposed between the first semiconductor chip 600 and the lower redistribution substrate 560 and electrically connecting the first semiconductor chip 600 and the lower redistribution substrate 560 to each other. For example, the connection members 620 may be formed to cover the entire upper surface of the pad portion 554, similar to the connection member 120 of FIG. 1. Since each of the connection members 620 is formed to cover the entire upper surface of the pad portion 554, the pad structure 550 and the underfill resin 630 may be disposed to be spaced apart from each other.

The first structure 500L may further include a vertical connection pattern 710 penetrating through the first encapsulant 640 and electrically connected to the second pad structure 550b. The vertical connection pattern 710 may be formed of a conductive material.

The first structure 500L may further include an upper redistribution substrate 760 on the first encapsulant 640 and the first semiconductor chip 600.

The upper redistribution substrate 760 may include an upper insulating structure 745 and a conductive structure 755. The conductive structure 755 may include an upper redistribution structure 735 and an upper pad structure 750.

The upper insulating structure 745 may include substantially the same material as the insulating structure 45 described with reference to FIG. 1. The upper insulating structure 745 may include a third lower insulating layer 715, a fourth lower insulating layer 725, and an upper insulating layer 740 sequentially stacked. In the drawings, the upper insulating structure 745 is illustrated as including three insulating layers 715, 725, and 740, but exemplary embodiments are not limited thereto and the upper insulating structure may include two insulating layers, four or more insulating layers.

The upper redistribution structure 735 may include a plurality of redistribution patterns 720 and 730 disposed at different height levels. For example, the plurality of redistribution patterns 720 and 730 may include a lower redistribution pattern 720 and an upper redistribution pattern 730. In FIG. 7, the plurality of redistribution patterns 720 and 730 are illustrated as two redistribution patterns disposed at different levels, but exemplary embodiments are not limited thereto. For example, the upper redistribution structure 735 may include only the lower redistribution pattern 720 because the upper redistribution pattern 730 is omitted, or may include three or more redistribution patterns disposed at different levels.

In the upper redistribution structure 735, the lower redistribution pattern 720 may include a redistribution via 720v, penetrating through the third lower insulating layer 715 and electrically connected to the vertical connection pattern 710, and a redistribution layer 720i extending from the redistribution via 720v and disposed on the third lower insulating layer 715. The lower redistribution pattern 720 may include a seed metal layer 722 and a metal material pattern 724 sequentially stacked.

In the upper redistribution structure 735, the upper redistribution pattern 730 may include a redistribution via 730v, penetrating through the fourth lower insulating layer 725 and electrically connected to the lower redistribution pattern 720, and a redistribution layer 730i extending from the redistribution via 730v and disposed on the fourth lower insulating layer 725. The upper redistribution pattern 730 may include a seed metal layer 732 and a metal material pattern 734 sequentially stacked.

The upper pad structure 750 may include a via portion 752, penetrating through the second upper insulating layer 740 and electrically connected to the upper redistribution pattern 730, and a pad portion 754 on the second upper insulating layer 740. The via portion 752 and the pad portion 754 of the upper pad structure 750 may be substantially the same as the via portion 52 and the pad portion 54 of the pad structure 50 described with reference to FIGS. 1 and 2, respectively. For example, the pad portion 754 of the upper pad structure 750 may have a hemispherical shape. A disposition relationship between the upper pad structure 750 and the pad 805 of the second semiconductor chip 800 or a relation between widths thereof may be substantially the same as those described with reference to FIGS. 1 to 5.

The second structure 500U may include a second semiconductor chip 800 disposed on the first structure 500L.

The second structure 500U may further include a connection member 820 electrically connecting the pad 805 of the second semiconductor chip 800 and the upper pad structure 750 of the upper redistribution substrate 760 between the pad 805 of the second semiconductor chip 800 and the upper pad structure 750. The connection member 820 may be substantially the same as the connection member 120 of FIG. 1.

The second structure 500U may cover at least a side surface of the second semiconductor chip 800 on the first structure 500L, and may further include a second encapsulant 840 covering a side surface of the connection member 820 between the second semiconductor chip 800 and the upper redistribution substrate 760. The second encapsulant 840 may cover an upper surface of the second semiconductor chip 800.

At least one of the first semiconductor chip 600 and the second semiconductor chip 800 may be a microprocessor such as a central processor unit (CPU), a graphics processor unit (GPU), an application processor (AP), or the like, a logic chip such as a field programmable gate array (FPGA), an application-specific IC (ASIC), a memory or the like. For example, the first semiconductor chip 600 may be a microprocessor such as a central processor unit (CPU), a graphics processor unit (GPU), an application processor (AP), or the like, or a logic chip such as a field programmable gate array (FPGA), application-specific IC (ASIC), or the like, and the second semiconductor chip 800 may include a memory chip.

As another example, one of the first semiconductor chip 600 and the second semiconductor chip 800 may be a volatile memory chip or a nonvolatile memory chip, and the other of the first semiconductor chip 600 and the second semiconductor chip 800 may be a control semiconductor chip for driving the memory chip. For example, the first semiconductor chip 600 may be a control semiconductor chip, and the second semiconductor chip 800 may be a volatile memory chip or a nonvolatile memory chip.

Figure 8:
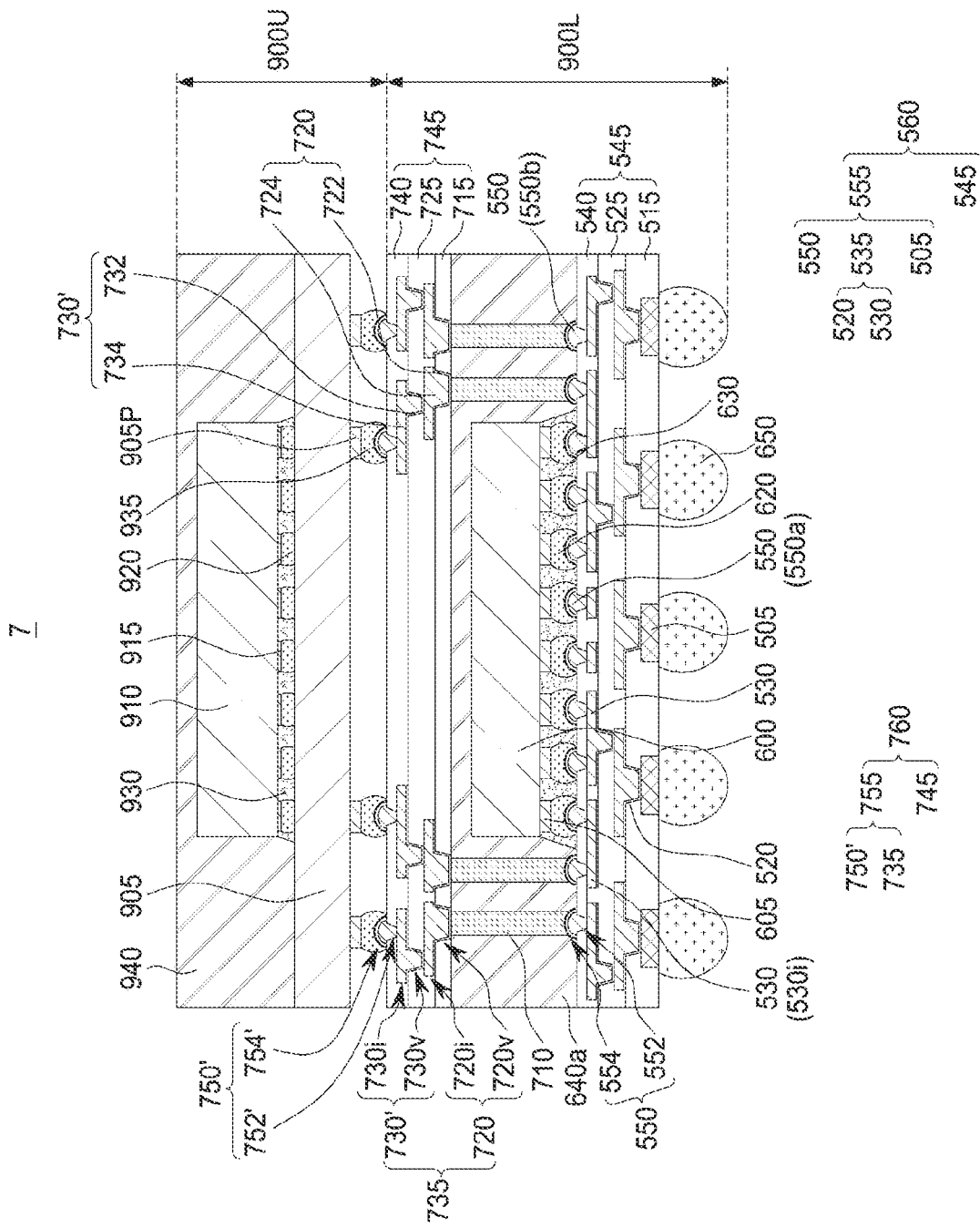
FIG. 8 is a cross-sectional view illustrating a modified example of a semiconductor package according to an exemplary embodiment.

FIG. 8 is a cross-sectional view illustrating a modified example of a semiconductor package according to an exemplary embodiment.

The semiconductor package 7 may include a first structure 900L and a second structure 900U on the first structure 900L. The first structure 900L may be substantially the same as or similar to the first structure 500L of FIG. 7. For example, in FIG. 7, the first structure 900L may include all elements of the first structure 500L except for the upper redistribution pattern 730 and the upper pad structure 750, and may include an upper redistribution pattern 730' and an upper pad structure 750', respectively corresponding to the upper redistribution pattern 730 and the upper pad structure 750.

The upper redistribution pattern 730' and the upper pad structure 750' may have substantially the same cross-sectional structure as the upper redistribution pattern 730 and the upper pad structure 750 described with reference to FIG. 7.

The second structure 900U may include a package substrate 905, a connection member 935 electrically connecting the package substrate 905 and the upper pad structure 750' of the first structure 900L to each other between the package substrate 905 and the upper pad structure 750' of the first structure 900L, and a second semiconductor chip 910 mounted on the package substrate 905. The package substrate 905 may be a printed circuit board (PCB) or an interposer substrate.

The second semiconductor chip 910 may be mounted on the package substrate 905 in a flip-chip structure or a wire bonding structure. For example, when the second semiconductor chip 910 is mounted on the package substrate 905 in a flip-chip structure, the second structure 900U may include a connection member 920 electrically connecting the pad 915 of the second semiconductor chip 910 and the package substrate 905 between the pad 915 of the second semiconductor chip 910 and the package substrate 905.

The second structure 900U may further include an underfill resin 930, surrounding a side surface of the connection member 920 between the pad 915 of the second semiconductor chip 910 and the package substrate 905, and an encapsulant 940 surrounding at least a side surface of the second semiconductor chip 910 on the package substrate 905. As a further example, the underfill resin 930 and the encapsulant 940 may be formed of a single material in a single process.

FIGS. 9A to 9F are cross-sectional views illustrating a method of manufacturing a semiconductor package according to an exemplary embodiment.

Figure 9A:
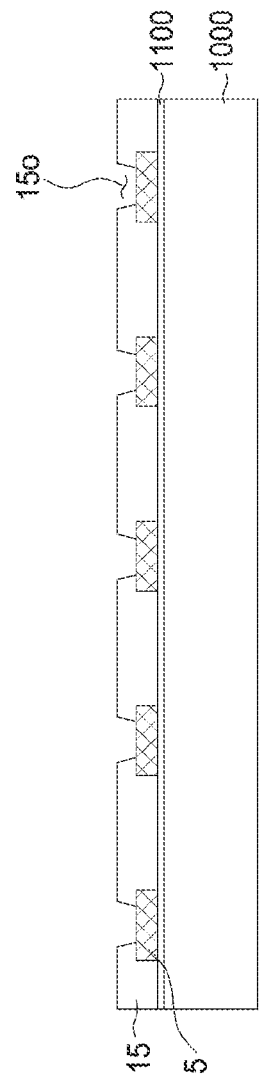
FIGS. 9A to 9F are cross-sectional views illustrating a method of manufacturing a semiconductor package according to an exemplary embodiment.

Referring to FIG. 9A, a carrier 1000 and a lower seed layer 1100 disposed on the carrier 1000 may be formed. A lower conductive pattern 5 and a first lower insulating layer 15 may be formed on the lower seed layer 1100.

The lower seed layer 1100 may be formed of a metal material, for example, copper (Cu), aluminum (Al), silver (Ag), tin (Sn), gold (Au), nickel (Ni), lead (Pb), or titanium (Ti), or any alloys thereof. The lower seed layer 1100 may be in the form of a thin film having a single-layer or multilayer structure. The lower seed layer 1100 may include, for example, a first layer including titanium and a second layer including copper.

Next, a lower conductive pattern 5 and a first lower insulating layer 15 may be formed on the lower seed layer 1100. The first lower insulating layer 15 may be the same as the first lower insulating layer 15 described with reference to FIG. 1. Then, an opening 15o may be formed to expose at least a portion of the lower conductive pattern 5 through the first lower insulating layer 15.

Figure 9B:
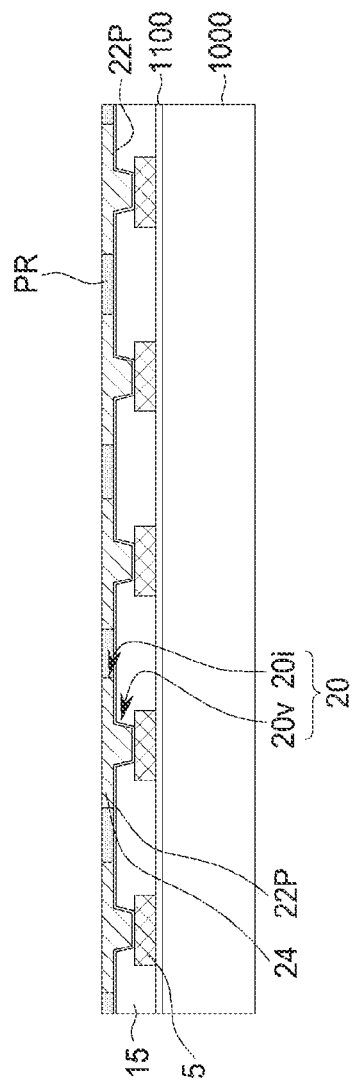

Referring to FIG. 9B, a first redistribution via 20v, in contact with the lower conductive pattern 5 while filling the opening 15o of FIG. 9A, and a first redistribution layer 20i, extending from the first redistribution via 20v and disposed on the first lower insulating layer 15, may be formed.

In exemplary embodiments, a seed layer 22p may be formed on the first lower insulating layer 15 including the opening 15o. Accordingly, the seed layer 22p may be formed so as to be disposed on an upper surface of the first lower insulating layer 15, a sidewall of the opening 15o, and the lower conductive pattern 5.

Next, a photosensitive insulating pattern PR may be formed on the first lower insulating layer 15. The photosensitive insulating pattern PR may be formed by forming a photosensitive insulating material on the first lower insulating layer 15 and then performing a photoresist process.

Next, a lower redistribution pattern 20 may be formed on the first lower insulating layer 15 exposed by the photosensitive insulating pattern PR. The lower redistribution pattern 20 may be in contact with the seed layer 22p. The lower redistribution pattern 20 may be formed using a plating process.

Figure 9C:
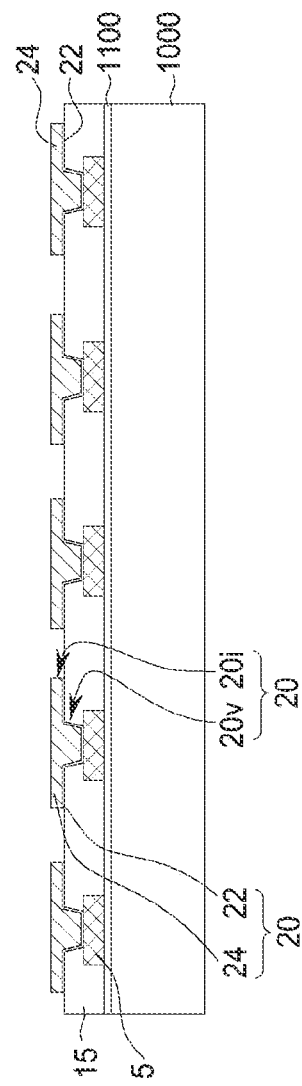

Referring to FIG. 9C, a first seed metal layer 22 may be formed by removing the photosensitive insulating pattern PR and etching the seed layer 22p in a region in which the lower redistribution pattern 20 is absent.

Figure 9D:
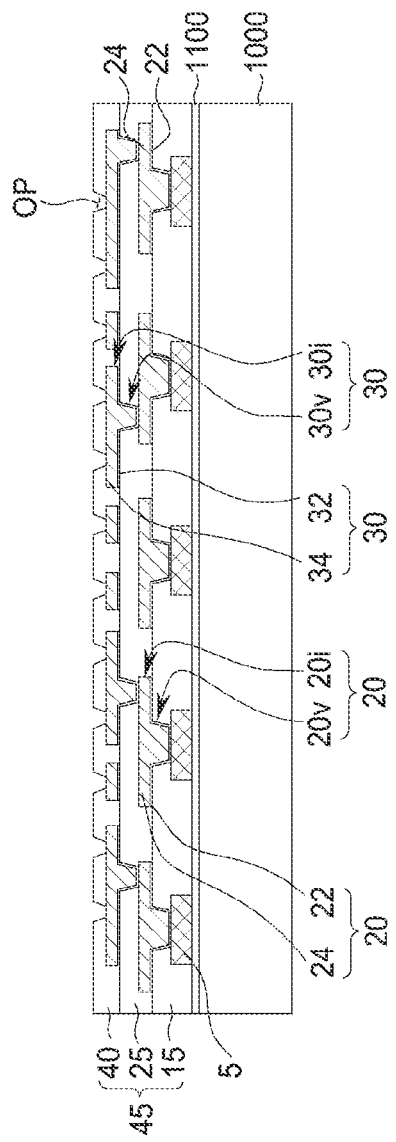

Referring to FIG. 9D, a second lower insulating layer 25 may be formed on the first lower insulating layer 15, and an upper redistribution pattern 30 may be formed. The upper redistribution pattern 30 may include a second redistribution via 30v, electrically connected to the lower redistribution pattern 20, and a second redistribution layer 30i extending from the second redistribution via 30v and disposed on the second lower insulating layer 25. Then, an upper insulating layer 40 may be formed on the second lower insulating layer 25 including the opening OP. The upper redistribution pattern 30 may be formed in the same manner as the lower redistribution pattern 20 described with reference to FIG. 9B. The opening OP of the upper insulating layer 40 may be formed in a region corresponding to the region in which the pad structure 50 of FIG. 1 is disposed.

Figure 9E:
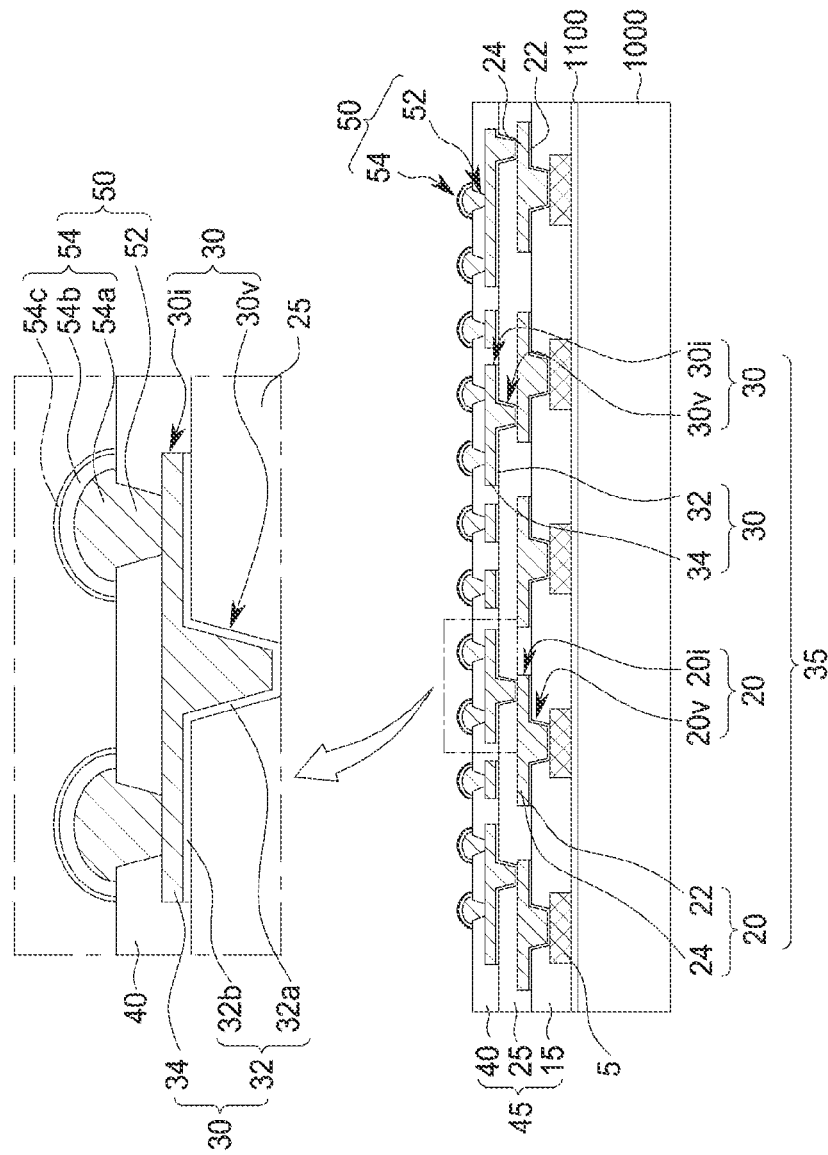

Referring to FIG. 9E, a pad structure 50 may be formed. The pad structure 50 may include a via portion 52, in contact with the upper redistribution pattern 30 while filling the opening OP of the upper insulating layer 40, and a pad portion 54 disposed at a level higher than an upper surface of the upper insulating layer 40.

The pad structure 50 may be formed by a bottom-up plating method using a lower seed layer 1100 disposed on a carrier 1000. The pad structure 50 may be formed by a plating process using a current flowing in a direction from the lower seed layer 1100 disposed on the carrier 1000 toward the opening OP of the upper insulating layer 40. Unlike the method of forming the lower redistribution pattern 20 and the upper redistribution pattern 30 described with reference to FIGS. 9B to 9C, an operation of forming a seed layer and an operation of forming a photosensitive insulating layer are not included. Therefore, a side surface of the via portion 52 and a lower surface of the pad portion 54 of the pad structure 50 may be in contact with the upper insulating layer 40. That is, a seed metal layer may not be disposed on the side surface of the via portion 52 and the lower surface of the pad portion 54 of the pad structure 50. A width W1 of the lower surface of the pad portion 54 of the pad structure 50, formed by the bottom-up plating method, may be about 4 μm to about 10 μm greater than a maximum width W2 of the via portion 52. The pad portion 54 may be formed to have a hemispherical shape.

The pad portion 54, including the first conductive material layer 54a, the second conductive material layer 54b, and the third conductive material layer 54c sequentially stacked, may be formed by a plating process. According to exemplary embodiments, the third conductive material layer 54c may be omitted. The first conductive material layer 54a may include, for example, copper (Cu). The first conductive material layer 54a may include the same material as the via portion 52. The second conductive material layer 54b may include, for example, at least one of gold (Au), nickel (Ni), benzimidazole, tin (Sn), and a tin-silver alloy (SnAg). The third conductive material layer 54c may include a metal material different from that of the second conductive material layer 54b. For example, when the second conductive material layer 54b includes nickel (Ni), the third conductive material layer Mc may include gold (Au). The second conductive material layer 54b and the third conductive material layer Mc may be formed by an electroplating process or an electroless plating process.

Figure 9F:
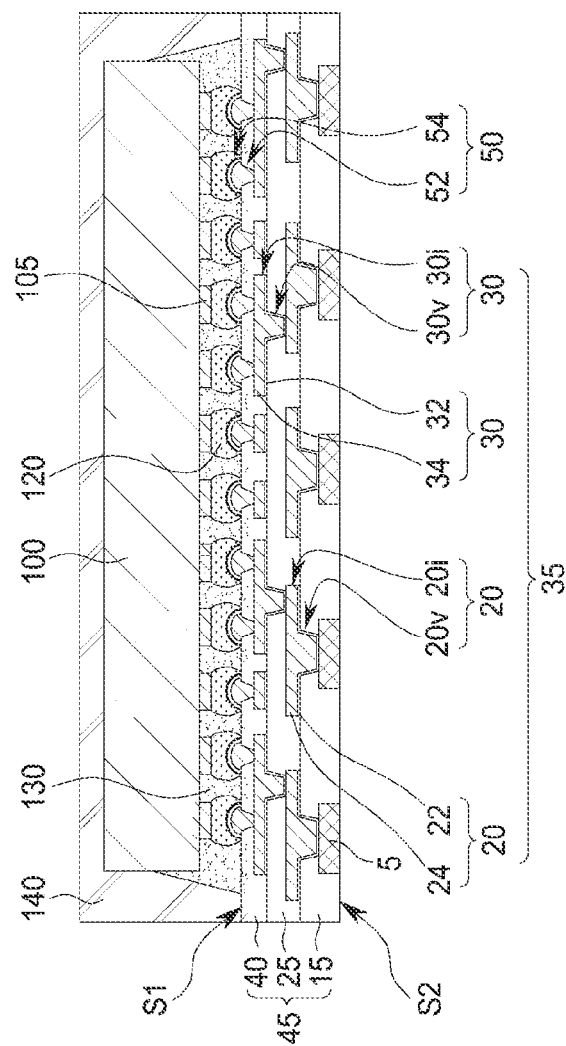

Referring to FIG. 9F, a semiconductor chip 100 may be prepared. The semiconductor chip 100 may be the semiconductor chip 100 as in FIG. 1, or one of the semiconductor chips 300a, 300b, 300c of FIGS. 6, 600 of FIGS. 7 and 8, and 905 of FIG. 8. Hereinafter, the semiconductor chip 100 of FIG. 1 will be used as an example for ease of description.

The semiconductor chip 100 may be mounted on a structure including the insulating structure 45 and the conductive structure 55. For example, the semiconductor chip 100 may include a pad 105, and the pad 105 of the semiconductor chip 100 and the pad structure 50 may be bonded to each other using the connection member 120. In this case, the pad portion 54 of the pad structure 50 has a hemispherical shape, so that a height of the connection member 120 may be substantially the same as a distance between a lower surface of the pad 105 and an upper surface of the upper insulating layer 40. The connection member 120 may include a solder material. For example, the connection member 120 bonded to the pad 105 of the semiconductor chip 100 and the pad structure 50 may be formed using a solder reflow process. An underfill resin 130 may be formed to surround a side surface of the connection member 120 between the insulating structure 45 and the semiconductor chip 100. An encapsulant 140 may be formed to cover at least a side surface of the semiconductor chip 100 on the insulating structure 45.

Next, the carrier (1000 of FIG. 9E) and the lower seed layer (1100 of FIG. 9E) may be removed to expose a second surface S2 of the redistribution substrate 60.

Returning to FIG. 1, a connection bump 150 may be formed to be in contact with a lower surface of the lower conductive pattern 5. The connection bump 150 may be formed of a solder ball.

As described above, according to exemplary embodiment, a pad portion of a redistribution substrate may be formed using a bottom-up plating method to simplify a manufacturing process.

According to exemplary embodiments, a pad portion of a redistribution substrate may be formed using a bottom-up plating method to have a hemispherical shape. Thus, a contact area between the pad portion and a connection bump may be increased to improve connection reliability between the redistribution substrate and a semiconductor chip mounted thereon.

While exemplary embodiments have been shown and described above, it will be apparent to those skilled in the art that modifications and variations could be made without departing from the scope of the present inventive concept as defined by the appended claims.

What is claimed is:

1. A semiconductor package, comprising:
a redistribution substrate including a lower insulating layer, a redistribution via penetrating through the lower insulating layer, a redistribution layer connected to the redistribution via on the lower insulating layer, and an upper insulating layer over the lower insulating layer and having a first surface and a second surface opposing the first surface;
a pad structure including a pad portion, disposed on the first surface of the redistribution substrate, and a via portion penetrating through the upper insulating layer to connect the redistribution layer and the pad portion to each other, wherein the pad portion includes a first conductive material layer, a second conductive material layer distinct from the first conductive material, and a third conductive material layer distinct from the first and the second conductive material, and the first, second, and third conductive material layers have upwardly convex surfaces, respectively;
a semiconductor chip disposed on the first surface of the redistribution substrate and including a pad; and
a connection member in contact with the pad portion and the pad of the semiconductor chip between the pad structure and the pad of the semiconductor chip,
wherein the pad portion of the pad structure has a hemispherical shape, and a side surface of the via portion of the pad structure is in contact with the upper insulating layer.

2. The semiconductor package of claim 1, wherein a portion of a lower surface of the pad portion of the pad structure is in contact with upper insulating layer.

3. The semiconductor package of claim 1, wherein at least a portion of the first conductive material layer is in contact with the upper insulating layer.

4. The semiconductor package of claim 1, wherein the first conductive material layer includes copper (Cu).

5. The semiconductor package of claim 1, wherein the second conductive material layer include at least one of gold (Au), nickel (Ni), benzimidazole, tin (Sn), and a tin-silver alloy (SnAg).

6. The semiconductor package of claim 1, wherein a thickness of the second conductive material layer is less than a thickness of the first conductive material layer, and a thickness of the third conductive material layer is less than the thickness of the second conductive material layer.

7. The semiconductor package of claim 1, wherein a width of a lower surface of the pad portion of the pad structure is about 4 μm to about 10 μm greater than a maximum width of the via portion of the pad structure.

8. The semiconductor package of claim 1, wherein a width of a lower surface of the pad portion of the pad structure is about 4 μm to about 7 μm greater than a maximum width of the via portion of the pad structure.

9. The semiconductor package of claim 1, wherein a height of the pad portion of the pad structure ranges from about 2.5 μm to about 6 μm.

10. The semiconductor package of claim 1, wherein the connection member further includes a portion in contact with the upper insulating layer.

11. The semiconductor package of claim 1, further comprising: an underfill resin disposed between the first surface of the redistribution substrate and the semiconductor chip and surrounding at least a side surface of the connection member, wherein the underfill resin is spaced apart from the pad structure.

12. A semiconductor package comprising:
a redistribution substrate including a lower insulating layer, a redistribution via penetrating through the lower insulating layer, a redistribution layer connected to the redistribution via on the lower insulating layer, and an upper insulating layer on the lower insulating layer and having a first surface and a second surface opposing the first surface;
a pad structure including a pad portion, disposed on the first surface of the redistribution substrate, and a via portion penetrating through the upper insulating layer to connect the redistribution layer and the pad portion to each other;
a semiconductor chip disposed on the first surface of the redistribution substrate and including a pad; and
a connection member disposed between the pad structure and the pad of the semiconductor chip,
wherein the pad portion of the pad structure has a hemispherical shape, and includes a first conductive material layer, a second conductive material layer distinct from the first conductive material disposed on the first conductive material layer and having a thickness that is less than a thickness of the first conductive material layer, and a third conductive material layer distinct from the first and the second conductive material disposed on the second conductive material layer and the first, second, and third conductive material layers have upwardly convex surfaces, respectively.

13. The semiconductor package of claim 12, wherein each of the first conductive material layer and the second conductive material layer is in contact with the upper insulating layer.

14. The semiconductor package of claim 12, wherein a height of the connection member is substantially the same as a distance between a lower surface of the pad of the semiconductor chip and an upper surface of the upper insulating layer.

15. The semiconductor package of claim 12, wherein the third conductive material layer has a thickness that is less than a thickness of the second conductive material layer and wherein the first conductive material layer includes copper (Cu), the second conductive material layer includes nickel (Ni), and the third conductive material layer includes gold (Au).

16. A semiconductor package comprising:
a redistribution substrate including a lower insulating layer, a redistribution via penetrating through the lower insulating layer, a redistribution layer connected to the redistribution via on the lower insulating layer, and an upper insulating layer over the lower insulating layer and having a first surface and a second surface opposing the first surface;

a pad structure including a pad portion, disposed on the first surface of the redistribution substrate, and a via portion penetrating through the upper insulating layer to connect the redistribution layer and the pad portion to each other;

a semiconductor chip disposed on the first surface of the redistribution substrate and electrically connected to the redistribution layer and comprising a pad; and a connection member disposed between the pad structure and the pad of the semiconductor chip, wherein the pad portion of the pad structure has a hemispherical shape, includes a first conductive material layer, a second conductive material layer disposed on the first conductive material layer and including a material different from a material of the first conductive material layer, and a third conductive material layer disposed on the second conductive material layer and including a material different from either the material of the first conductive material layer and from a material of the second conductive material layer, and the first, second, and third conductive material layers have upwardly convex surfaces, respectively, and wherein each of the first conductive material layer, the second conductive material layer, and the third conductive material layer is in contact with an upper surface of the upper insulating layer.

17. The semiconductor package of claim 16, further comprising: an insulating resin surrounding at least a surface of the connection member and in contact with the connection member between the first surface of the redistribution substrate and the semiconductor chip, wherein the insulating resin is spaced apart from the pad structure.

* * * * *